(12) United States Patent
Amidi

(10) Patent No.: US 12,321,249 B2
(45) Date of Patent: Jun. 3, 2025

(54) SYSTEMS AND METHODS FOR REDUCING ERROR LOG REQUIRED SPACE IN SEMICONDUCTOR TESTING

(71) Applicant: Intelligent Memory Limited, New Territories (HK)

(72) Inventor: Mike Hossein Amidi, Lake Forest, CA (US)

(73) Assignee: Intelligent Memory Limited, Kwai Chung (HK)

( * ) Notice: Subject to any disclaimer, the term of this patent is extended or adjusted under 35 U.S.C. 154(b) by 0 days.

(21) Appl. No.: 18/423,107

(22) Filed: Jan. 25, 2024

(65) Prior Publication Data

US 2024/0160547 A1    May 16, 2024

Related U.S. Application Data

(63) Continuation-in-part of application No. 17/985,037, filed on Nov. 10, 2022, now Pat. No. 12,099,424.

(51) Int. Cl.
 *G06F 11/273* (2006.01)

(52) U.S. Cl.
 CPC ................ *G06F 11/2733* (2013.01)

(58) Field of Classification Search
 None
 See application file for complete search history.

(56) References Cited

U.S. PATENT DOCUMENTS

| | | | | |
|---|---|---|---|---|
| 5,146,592 A * | 9/1992 | Pfeiffer | ................. | G06F 7/5443 345/545 |
| 6,320,812 B1 * | 11/2001 | Cook, III | ............... | G11C 29/56 365/201 |
| 6,373,758 B1 * | 4/2002 | Hughes | .................. | G11C 29/72 365/201 |
| 6,519,725 B1 * | 2/2003 | Huisman | ................ | G11C 29/10 714/718 |
| 6,941,232 B2 | 9/2005 | Burke, Jr. et al. | | |

(Continued)

FOREIGN PATENT DOCUMENTS

| CN | 103390432 B | 4/2017 |
|---|---|---|
| CN | 105183595 B | 10/2018 |

(Continued)

OTHER PUBLICATIONS

SPGA Chips Boast Hihg SPeed and Embedded Core, edn.com, Nov. 7, 1996, 2 pages.

(Continued)

*Primary Examiner* — Guerrier Merant
(74) *Attorney, Agent, or Firm* — Fish IP Law, LLP

(57) ABSTRACT

A memory testing device uses a master control unit (MCU) to concurrently operate multiple, intelligent, slave control units (SCUs). The MCU or an SCU translates memory addresses of a device under test (DUT) into a matrix. The SCU accumulates error data by testing a test bit of the memory across multiple cells of the matrix, the accumulated error data is post-processed to determine if the test bit is faulty, and the process is repeated for additional test bits. The post-processed data is analyzed to identify one or more of the test bits as faulty, and then include in a test log preferably only a single instance of a memory address that corresponds to each of the one or more faulty test bits.

24 Claims, 6 Drawing Sheets

Prior Art Volatile Memory Device Tester

(56) References Cited

U.S. PATENT DOCUMENTS

| | | | |
|---|---|---|---|
| 7,707,468 B2 | 4/2010 | Volkerink et al. | |
| 9,570,199 B2 * | 2/2017 | Chinnakkonda Vidyapoornachary | ............ G11C 29/50004 |
| 9,817,062 B2 | 10/2017 | Roberts, Jr. | |
| 2004/0181731 A1 * | 9/2004 | Rajsuman | G06F 11/263 714/747 |
| 2004/0210803 A1 * | 10/2004 | Cheng | G11C 29/44 714/710 |
| 2007/0260790 A1 * | 11/2007 | Chen | G06F 8/65 710/110 |
| 2012/0072788 A1 * | 3/2012 | Chen | G11C 29/28 714/E11.169 |
| 2014/0173345 A1 * | 6/2014 | Gorti | G11C 29/16 714/30 |
| 2014/0192583 A1 * | 7/2014 | Rajan | G11C 7/10 365/63 |
| 2017/0115351 A1 | 4/2017 | Datla Jagannadha et al. | |
| 2018/0336111 A1 * | 11/2018 | Gendler | G06F 1/3287 |
| 2021/0174892 A1 * | 6/2021 | Nadeau-Dostie | G11C 29/36 |
| 2024/0221854 A1 * | 7/2024 | Chavali | G11C 29/36 |

FOREIGN PATENT DOCUMENTS

| | | |
|---|---|---|
| CN | 109545264 A | 3/2019 |
| CN | 110161400 B | 9/2020 |
| CN | 212484339 U | 2/2021 |
| EP | 4020758 A1 | 6/2022 |
| EP | 1858028 | 12/2022 |
| WO | WO-2004104840 A2 * | 12/2004 ............ G06F 11/106 |

OTHER PUBLICATIONS

Final Rejection for related U.S. Appl. No. 17/985,037, dated May 1, 2024, 34 pages.

* cited by examiner

Prior Art Volatile Memory Device Tester

Prior Art Non-volatile Memory Device Tester

Prior Art Volatile Memory DIMM Tester

Prior Art Non-volatile Memory Module Tester

Current Invention Tester Architecture

SYSTEMS AND METHODS FOR REDUCING ERROR LOG REQUIRED SPACE IN SEMICONDUCTOR TESTING

PRIORITY

This application is a continuation-in-part of pending U.S. patent application Ser. No. 17/985,037 filed Nov. 10, 2022.

BACKGROUND

Computer systems utilize both volatile and non-volatile memories to store and retrieve data. Volatile memories are advantageous because they achieve quicker access time compared to traditional hard drive (HDD) or Solid State Drives (SSD) devices. In general, the access time of volatile memories is at least one magnitude faster than traditional HDD or SSD devices. Volatile memories are generally used to store and retrieve data for shorter durations since they lose data when power is lost/removed.

Non-volatile memories are advantageous in that they retain data even after power is lost/removed. As such, non-volatile memories are generally used to store and retrieve data for longer durations, and to allow other computer systems to access the data.

Due to current on-going demand for higher access speeds, the majority of computer systems utilize a combination of volatile memories to temporarily store data, and non-volatile memories to store and retrieve data for longer periods of time, including for example seconds, minutes, hours, days, months, or even years.

Volatile and non-volatile memories are usually assembled from individual dies from semiconductor wafers fabricated by specific lithography processes. In general, these wafers and their dies are tested for proper electrical operational and functionality based on a given specification for their voltages (DC levels) and timing (AC level) parameters. Once one or more good known dies are identified within a wafer, then these dies will be taken through a packaging process so that a final product can be built using individual volatile and non-volatile memories device packages.

Both volatile and non-volatile memories can be packaged and assembled using single dies, and also dual, quad, and octal dies, and beyond. In some instances, the packages include monolithic or multiple dies arranged in sub-systems.

Manufacturers and suppliers want both volatile and or non-volatile memories to be reliable, robust, and operational for the life of the product. To help insure those qualities, memory components are often subjected to rigorous testing. Given the complexity of volatile and non-volatile packages, one can imagine the importance of robust testing for building sub-systems and final, fully-assembled systems. Due to one or more dies inside Volatile and/or Non-Volatile memory packages can have manufacturing-related issues such as Open or Short due to process and setup variations during assembly and fabrication of packages, there is a need to test and detect signals being open (i.e., Not connected to the intended points) or short (i.e., being wrongfully connected to nearby Power, Ground, or other signals) causing unwanted behaviors. There can also be a bad connect to a memory module printed circuit board (PCB), due to mechanical stress, manufacturing issues, thermal issues, electrical issues, or any other relevant manufacturing-related process variants. Applying proper DC level testing can detect these erroneous Open and Short and connection issues.

Many companies provide generic semiconductor testing equipment, which is then customized to test voltage, frequency, and temperate for specific memories, using application-specific integrated circuits (ASICs) or Field programmable Gate Arrays (FPGAs).

In general, such generic testers are limited to testing either volatile memories or non-volatile memories, but not both. Generic testers are also limited in that they are only capable of implementing fixed functional test patterns against existing industry standards, using Automatic Test Pattern Generation (ATPG) patterns. Taken together, these limitations are problematic in that memories are not tested in end-user products running end-user software. Nor can they replicate the circumstances in which a memory failure occurred in an end-user product. Accordingly, there is no way to use generic testers to effectively predict end-user needs, or fix many of the end-user problems.

U.S. Pat. No. 7,707,468 to Volkerink describes a testing device in which a memory controller manages a star arrangement in which each of multiple interface boards work in parallel to test multiple memory modules. The arrangement allows concurrent testing of the various memory modules at different operating rates, but the patent is silent with respect to concurrent testing of both volatile and or non-volatile memories. Moreover, the interface boards are not intelligent, so they cannot operate on multiple different testing patterns downloaded from the memory controller. There is also no teaching, suggestion, or motivation to test memory modules while they are running application software.

Therefore, there exists a demand for a semiconductor testing system (1) capable of testing both volatile and non-volatile memory devices, (2) with either one or multiple dies in a package, and (3) in a testing environment that closely mimics an end-user's host system (i.e. PC, laptop, server, cloud, etc.) and software. Ideally, such a system would provide detailed AC and DC level test coverage, along with functional tests under normal operating temperature, high and low temperature, high-nominal-low voltage levels, and high-nominal-low frequency of operation to fully stress, exercise, and perform real world functional tests at operating speed of the host system. A system as such should be capable of running end customer application on a local operating system (OS) capable of executing one or multiple application to mimic target host application environment.

SUMMARY OF THE INVENTION

The inventive subject matter described herein provides dynamic real-time testing for both volatile and non-volatile arrays of memories. In contemplated apparatus, systems, and methods, a memory tester unit is capable of reconfiguring (a) its Input and Output (I/O) pins Voltage levels, and (b) its operational frequencies dynamically, without any system reboot requirements, and performing different real-time testing patterns for different volatile families of products and/or different non-volatile families of products.

Contemplated memory tester units comprise several components as described hereinafter. A Master Controller Unit (MCU) manages one or more Slave Controller Unit (SCU) capable of testing both volatile and non-volatile memories. Each SCU is capable of conducting one or more different real-time test patterns running on one or more fully isolated memory channels of the same or different type of memories. By utilizing this modular approach the MCU can program one or more SCU in parallel to perform gang/parallel testing to one or more memory devices, which improves productivity and testing speed, and reduces total testing cost. A single operator can load the proper test pattern into one MCU, and the MCU can upload the test pattern into one or many SCUs, each operating with a required real-time test pattern, and with each SCU memory channel testing one or more memory devices, regardless of whether the individual memories being tested have monolithic, dual, quad, octal, or other number of dies.

Master Control Units

As contemplated herein, an MCU can connect to each SCU via a traditional wired or wireless method to program and initialize the SCU unit. The MCU can advantageously use a smart, fully automated scanner method to automatically load the proper MCU program to load and execute each SCUs. This automation process is contemplated to further improve utilization, reduces human error, and improve overall test cost.

As noted above, each memory tester unit can have one or more MCU, where each MCU connects to one or more SCU, and each SCU can address one or more memory channels. It is also contemplated that each memory channel can have one or more Device Under Test boards (DUTs), where each of the DUTs has one or more sockets to test individual memory packages of either volatile and or non-volatile memories. As should be apparent to someone with expertise in this field upon understanding this application, one can use a single scanned program to test several hundred memory package at any given time.

MCU at the beginning of Test Profile can apply one or more operating tasks, procedures, functions, or algorithms to one or more SCU to detect unwanted manufacturing, assembly, or packaging defect of one or more dies of Volatile and/or Non-Volatile memory packages with Open and Short. The SCU along with analog and digital logic can use various apparatus to detect these anomalies and erroneous faults in Volatile and/or Non-Volatile memory packages. In one embodiment of this invention the SCU can inject and controlled current into each Device Under Test sockets (DUT) pins and its associated Volatile and/or Non-Volatile memory packages to measure its corresponding reading voltages from each Volatile and/or Non-Volatile memory package pins internal protective circuit Diode to see if there would be a continuity of current flow from SCU input/output pins to Volatile and/or Non-Volatile memory devices connected to DUT sockets. If the device is present with proper connection, then SCU would be able to read proper voltage drop across internal protective Diode and detect proper connection, otherwise if the reading is zero then SCU knows that this pin is Open and faulty. In another embodiment SCU can inject current in one pin of DUT with Volatile or Non-Volatile memory packages and read proper voltage drops in the adjacent pin locations of the same Volatile or Non-Volatile memory packages to detect Short to nearby Power, Ground, or other adjacent nearby pins signals to detect potential Short and faulty Volatile or Non-Volatile memory packages.

MCUs can be connected to a Power Management Unit (PMU) configured to increase and decrease the input Voltage and Current to SCU I/O pins, Voltage rails of DUT memory sockets, and the rest of the circuit. This flexibility allows MCU to enable the same ecosystem to test different memory device packages that requires different operating voltage levels. (i.e. DRAM 5.0V, SDRAM 3.3V, DDR-I 2.5V, DDR-II 1.8V, DDR-III, 1.5V, DDR-IV 1.2V, etc.)

MCUs can also be connected to a Clock Management Unit (CMU) configured to provide a wide range of clock intervals for SCU core frequency operations, along with SCU I/O pins, and clock pins of DUT memory sockets. This capability allows SCU to support many different memory technologies requiring different operating frequencies. (i.e. SDRAM 100 Mhz, DDR-I 200 Mhz, DDR-II 400 Mhz, DDR-III 800 Mhz, and DDR-IV 1600 Mhz)

MCUs can also be configured to program on board Temperature Management Unit (TMU) chambers to provide nominal room temperature, low and high temperatures (i.e. −50 C to +155 C) to further stress a device under test for better sorting and separating good and marginal devices under the test.

MCUs can also be configured to vary Voltage, Frequency, and Temperature to perform solid 3 corner testing while applying customer memory testing patterns, and running DUT devices under real-time operations like target customer system.

MCUs can also be configured as an off the shelf Personal Computer (PC), or embedded PC to perform its tasks. Software running an MCU can advantageously perform all the task management of controlling Voltage, Frequency, Temperature, along with SCUs. In some embodiments, an MCU can be a dedicated processing unit (PU) comprised of one or more microcontroller, microprocessor, or processor units, with or without an Operating System (OS) running one or more FW to collectively control SCU, PMU, CMU, and TMU units.

Slave Control Units

The SCU can be configured in many ways, including embodiment in which the SCU can use any combination of software running on a PC, hardware running on an ASIC, or dynamic hardware running on FPGA. An SCU can be configured to have solid analog and digital logics, Finite State Machine (FSM), one or more processing units (i.e. micro controller, microprocessor, processor, etc.) or a combination of one or more of these methods.

In some embodiments, SCUs 516, 521 are configured to run one or more FW, to manage one or more tasks on one or more channels of each SCU, which can be connected to one or more DUTs, and exercise one or more series of volatile and/or non-volatile memory test patterns to one or more sockets connected to each DUT units. Such a configuration collectively allows a SCU to completely perform parametric testing, functional testing, of each connected sockets to each connected DUT per each SCU channel.

In one embodiment according to the inventive subject matter, a SCU has DUT and sockets for testing volatile memory devices.

In another embodiment according to the inventive subject matter, a SCU has DUT and sockets for testing non-volatile Memory devices.

In another embodiment according to the inventive subject matter, a SCU has DUT and sockets for testing volatile DIMM devices.

In yet another embodiment according to the inventive subject matter, a SCU has DUT and sockets for testing Non-volatile Module devices.

Contemplated SCU processing units can run one or more microcontroller, microprocessor, or processors using any of stand-alone bare metal firmware (FW), mini operating system, full blow embedded operating system, or real-time operating system (RTOS).

In general, the inventive subject matter described herein is intended to address the entire ecosystem of dynamically programming a highly flexible tester unit to test semiconductor volatile and non-volatile memories, by loading one configuration into MCU to dynamically program and execute one or many SCU, PMU, CMU, and TMU. The contemplated apparatus, systems and methods create a fully flexible, dynamic, programmable semiconductor testing system to test both volatile and non-volatile memory of different generations, under different voltages, different frequencies, and different thermal swings to fully stress. Customized, full functional tests can be run with real-time applications, which enable users to detect any AC and DC level parameters across the entire ranges of acceptable voltages, temperatures, and frequencies, including errors that would be undetectable by standard off the shelf semiconductor testers.

Firmware

In some embodiments, an SCU can perform certain operating tasks, procedures, functions, or algorithms to test Volatile and Non-Volatile memory packages by using one or more Firmware (FW) codes using one or more internal processing units either as standalone FW, scheduler, Operating System, or RTOS. The FW can perform any of write, read, modify, read-modify-write, or compare activities.

The FW running on an SCU processing unit can be done as one or more series of programming codes, to provide effective and efficient execution of the intended functionality, either as a single FW program or as a modular approach. The FW can be done with low level programming languages such as assembly or machine code, or higher abstract level such as C (i.e. C, C++, C ##, etc.) or object-oriented programming (OOP).

The FW can further implement one or more operating tasks (i.e. internal housekeeping task to make sure all connected Hardware blocks to SCU are initialized, booted, and working properly at all times, and from time to time check the health status of each Hardware block), one or more procedures (i.e. internal operational procedures to make sure both Hardware blocks status of current on hand tasks and/or queued tasks are known and collect any relevant information to monitor, fine tune, and report all relevant activities to MCU unit), one or more functions (i.e. internal functions to perform performance evaluation, Hardware and Firmware operating latencies, Hardware Power consumption, etc.), and one or more algorithms (i.e. any Volatile and/or Non-Volatile Memory testing, AC and/or DC level testing, Functional Testing, Customer AC and/or DC testing, Customer Functional Testing, Customer Application Testing for improved performance, reduced latency, and reduced power) to be executed by one or more microcontroller, microprocessor, or processors using any of stand-alone bare metal firmware (FW), mini operating systems, full blow embedded operating system, or real-time operating system (RTOS) with one or more Processing Units (PU), either as digital or analog logics, ASIC, FPGA, or FSM.

Any of the firmware algorithms can be converted into its equivalent Hardware algorithm for any operating tasks, procedures, functions, or algorithms that runs by one or more processing unit (PU) can further be improved by being implemented in pure digital logic, analog logic, ASIC, or FPGA to improve speed, reduce latency, and reduce power. Such Hardware implementations would necessarily be more efficient in speed, size, and power, which can drastically improve performance of a tester unit.

Reducing Size of Error Logs

FW can perform a series of ordinary memory transactions to access Volatile or Non-Volatile memory packages to perform FW write, FW read, FW modify, FW read-modify-write, or FW compare activities. In some methods a FW will start access Volatile or Non-Volatile memory packages with an address size of "N" either from beginning (i.e. Address Zero "0") or from end (i.e. Address N−1) to perform any tasks, procedures, functions, or algorithms, including for example, write, read, modify, or compare. This can be done either sequentially (i.e. one address after another) or randomly (i.e. addresses can jump any location within valid address range of "0" to "N−1"), by accessing each of the Data lines (i.e. x4-bit, x8-bit, x-16-bit, x32-bit, x64-bit, x72-bit, x-80 bit, etc.)

Memories of Volatile or Non-Volatile memory packages can alternatively be tested by translating linear memory addresses to Row and Column addresses. Where memory packages have multiple dies, linear memory addresses to Row and Column addresses can be translated for each die, so that the host can conveniently write, read, modify, or compare addresses in any size of data.

Conventional test devices and methods can create very large error logs. An ordinary Volatile memory can have a capacity of 8 Gbit (i.e. 1 Gbit×8 or 1 billion locations of 8-bit arranged internally to rows and column and internal banks). Large implementations have multiple Packages, as for example 8 Volatile Packages of 8 Gbit (1 Gbit×8) configurations often used in modern processors with a minimum of 64-bit data bus accesses. If one or more of the Packages has potential contact issues related to manufacturing processing, a memory test must exercise all Rows, all Columns, all Banks, and all packages along with all internal dies of a given memory module to produce all possible errors. Since conventional testers accesses memory modules in 64-bit fashion, the required error log memory within an ordinary tester unit must have capacity to withhold maximum Rows× maximum column×maximum Bank×number of dies locations, with each location capable of holding 64-bit data. This translates to 1 Gig location×64-bit or 1 Gig×8 Bytes=8 GB (8 Gig Byte) error log locations.

The current invention can reduce this error log drastically and improve manufacturing-related error detection log by a few factors. In one aspect, all possible rows×columns× banks×dies are tested for a single data bit (test data bit), with the error data post-processed against all know manufacturing-related issues such as open, short, or bad contact. The process is then repeated for the next test data bit data across all possible address locations, until each test data bit has been tested.

Once all rows×all columns×all banks×all dies×each data bit are collected and post processed, the final root cause of error can be placed in an error log. Depending on the type of error, the error log could be as small as few hundred bytes. For example, failure of test data bit across multiple rows, columns, banks, and dies is a clear indication that this test data bit is either OPEN (i.e. meaning no actual intended test data has been written into all relevant addresses hence the failure across all addresses) or SHORT to either Power, GND, or nearby adjacent signals (i.e. meaning Short to Power "Stuck at Fault Logic 1", Short to Ground "Stuck at Fault Logic 0"). Hence by doing FW Write, FW Read, FW Compare the test tasks, procedures, functions, or algorithms will detect these well-known issues, and mark this test data bit as faulty. There is no need to log the same repeated error in the error log file for each and every combination of rows, columns, banks, and dies address locations. This will drastically reduce the manufacturing-related error log by huge factor, saving storage space, processing, and power consumption relative to an otherwise lengthy error log.

Collectively, these features will help users reduce operational cost, reduce human error, improve yield, reduce system error, and improve system performance.

DETAIL DESCRIPTION OF INVENTION

Figure 1:
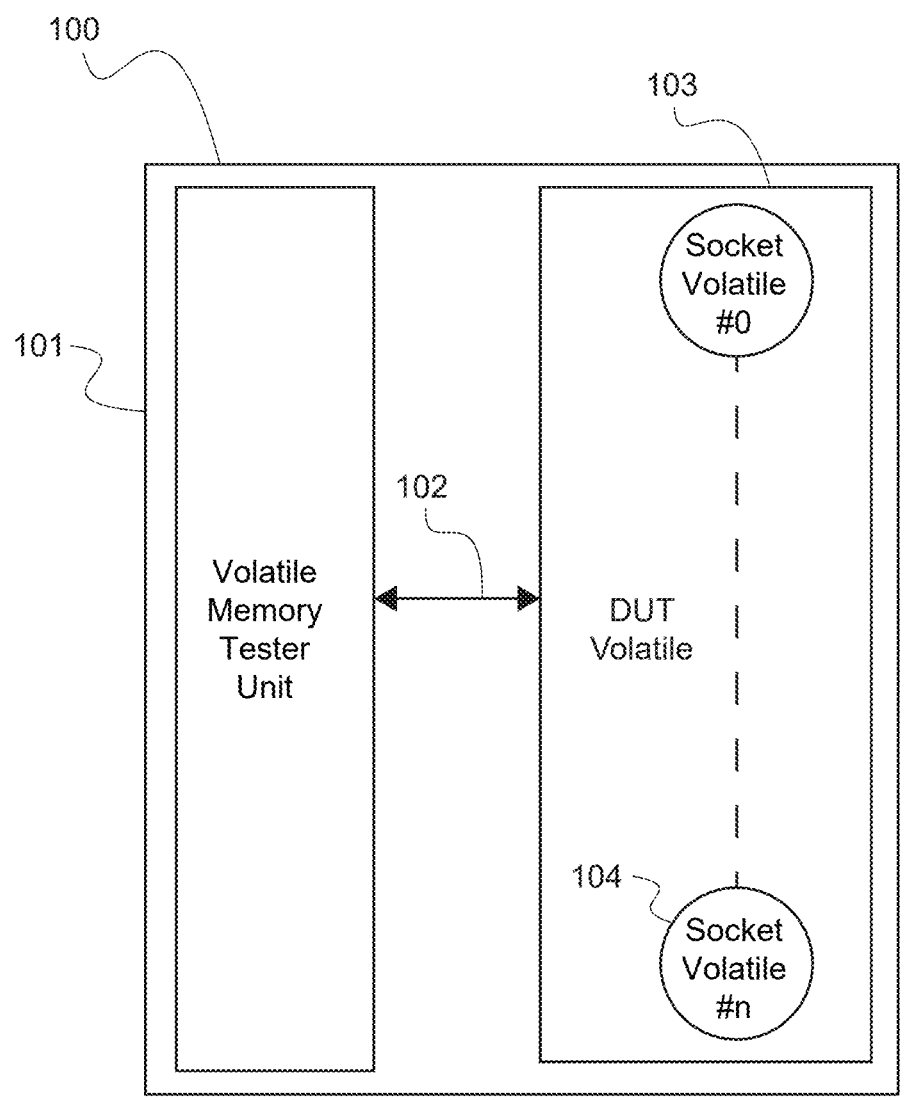
FIG. 1 is a diagram of a prior art volatile memory device tester.

FIG. 1 is a diagram of a prior art volatile memory device tester 100, which generally includes a volatile memory tester unit 101 connected to a Device Under Test (DUT) 103 via connection 102. DUT 103 comprises one or more sockets 104 #0-104 #n configured to communicate with volatile memory devices (not shown). Volatile memory device tester 100 allows an end user to perform standard off the shelf parametric testing on one or more volatile memory devices plugged into sockets 104 #0-104 #n, respectively.

Figure 2:
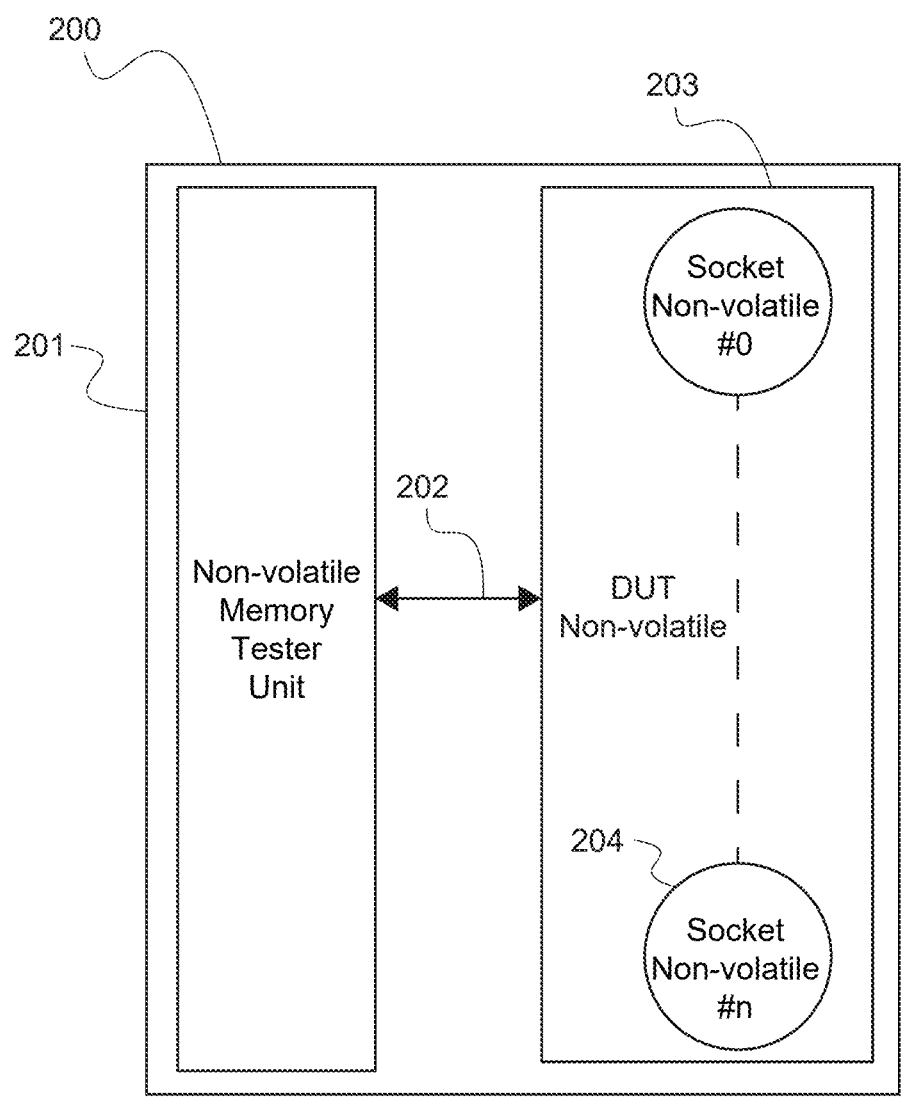
FIG. 2 is a diagram of a prior art non-volatile memory device tester.

FIG. 2 is a diagram of a prior art non-volatile memory device tester 200, which generally includes a volatile memory tester unit 201 connected to a Device Under Test (DUT) 203 via connection 202. DUT 203 comprises one or more sockets 204 #0-204 #n configured to communicate with non-volatile memory devices (not shown). Non-volatile memory device tester 200 allows an end user to perform standard off the shelf parametric testing on one or more non-volatile memory devices plugged into sockets 204 #0-204 #n, respectively.

Figure 3:
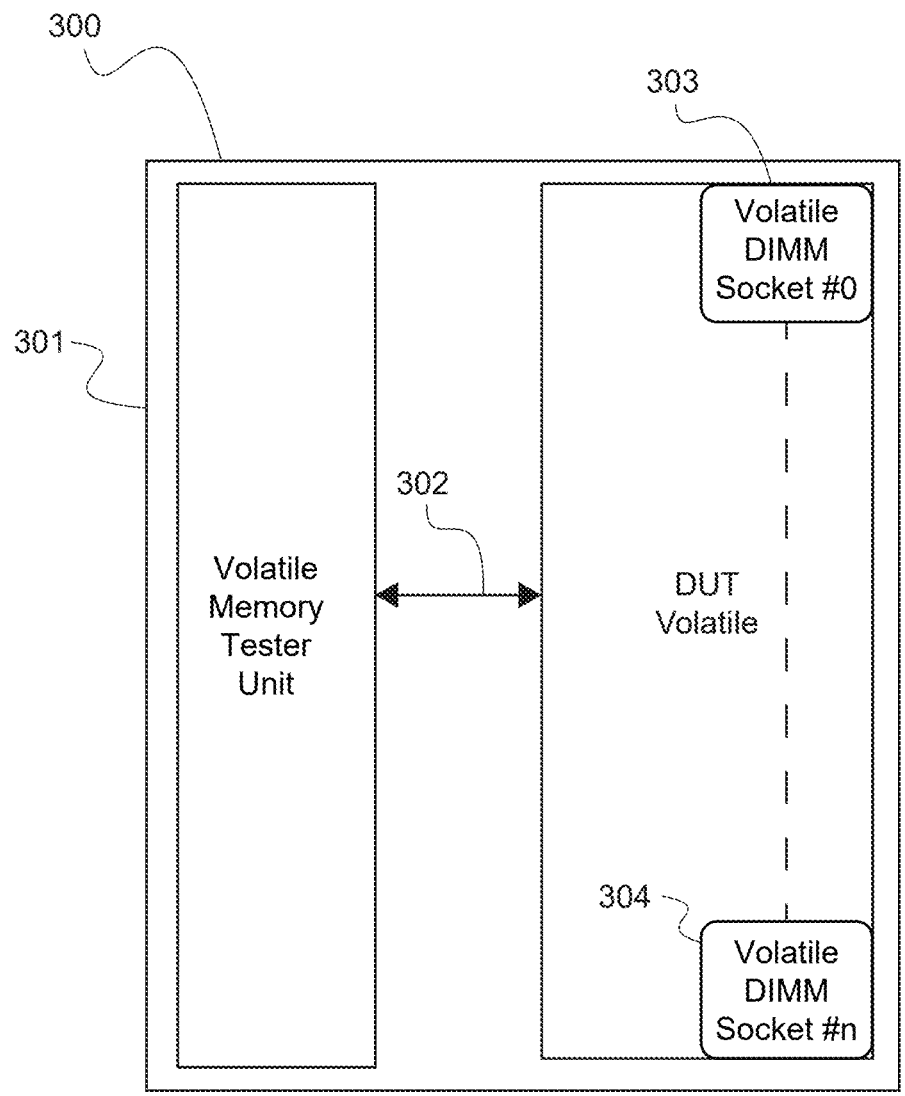
FIG. 3 is a diagram of a prior art volatile memory dimm tester.

FIG. 3 is a diagram of a prior art volatile memory dimm tester 300, which generally includes a volatile memory tester unit 301 connected to a Device Under Test (DUT) 303 via connection 302. DUT 303 comprises one or more dimm sockets 304 #0-304 #n configured to communicate with volatile memory dimm modules (not shown). Volatile memory dimm tester 300 allows an end user to perform standard off the shelf parametric testing on one or more volatile memory dimm modules plugged into dimm sockets 304 #0-304 #n, respectively.

Figure 4:
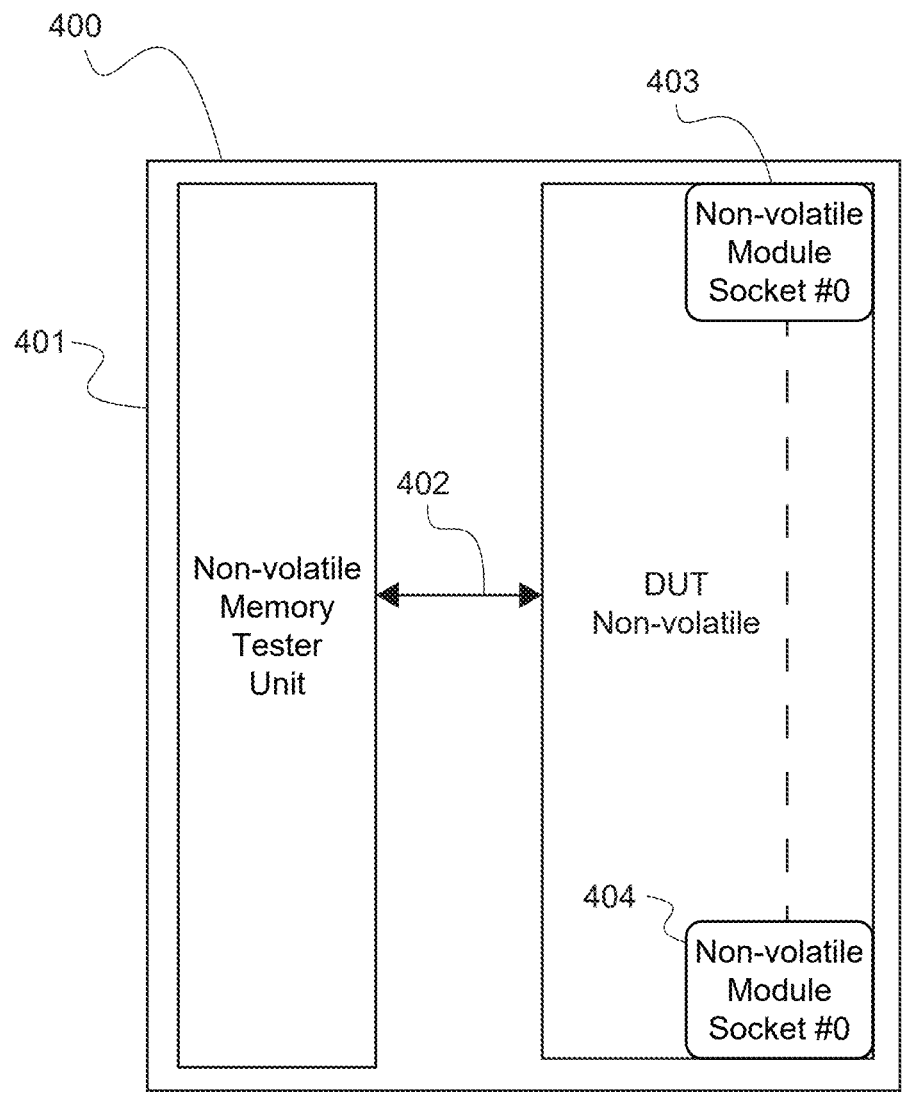
FIG. 4 is a diagram of a prior art non-volatile memory module tester.

FIG. 4 is a diagram of a prior art non-volatile memory module tester 400, which generally includes a volatile memory tester unit 401 connected to a Device Under Test (DUT) 403 via connection 402. DUT 403 comprises one or more module sockets 404 #0-404 #n configured to communicate with non-volatile memory modules (not shown). Non-volatile memory module tester 400 allows an end user to perform standard off the shelf parametric testing on one or more non-volatile memory devices plugged into module sockets 404 #0-404 #n, respectively.

Figure 5:
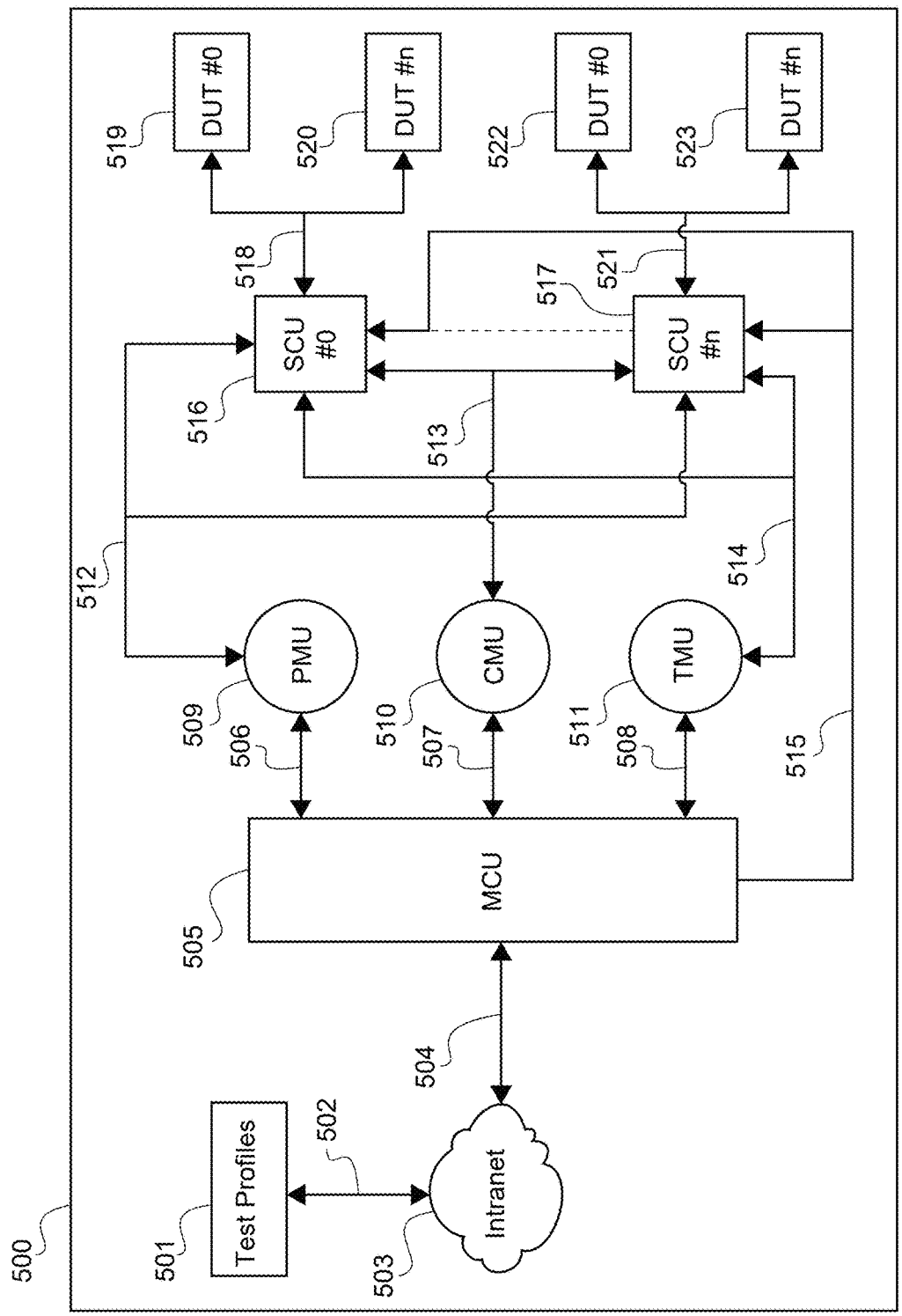
FIG. 5 is a schematic of a tester architecture of a device according to the inventive concepts herein.

FIG. 5 is a schematic of one embodiment of a tester architecture of a device 500 according to the inventive concepts herein. The device 500 is capable of testing both volatile and non-volatile memory device units, DIMMs, and module units. Device 500 generally comprises test profiles 501 of volatile and non-volatile memory testing patterns, a network 503, a MCU 505, PMU 509, CMU 510, and TMU 511, SCUs 516, 521, and multiple DUTs 519, 520, 522, 523.

Test profiles 501 communicate with the network 503 via communication line 502, and network 503 communicate with MCU 505 via communication line 504, which can be wired or wireless. The network can be any suitable network, including for example an intranet or extranet.

MCU 505 is configured to send a copy of any of the test profiles 501 to one or more of the SCUs 516, 521 via communication line 515. MCE 505 is connected to the PMUs 509, CMU 510, and TMU 511 by a communication bus (not shown) through communication lines 506, 507, and 508, respectively.

The MCU 505 is configured to individually program and change each of PMU 509, CMU 510, and TMU 511 individually, in series, or in parallel as it may require based on the test profiles 501. PMU 509 is connected to one or more SCUs 516, 521 via communication line 512. CMU 510 is connected to one or more SCUs 516, 521 via communication line 513. TMU 511 is connected to one or more SCUs 516, 521 via communication line 514. This architecture allows PMU, CMU, and TMU units to be individually capable of programming and controlling one or more SCUs 516, 521 in parallel.

SCU 518 is connected to DUT 519 and DUT 520 in parallel, where SCU 516 is connected to one or more DUTs via communication bus 518. DUT 519 represents the first of n1 DUTs, and DUT 520 represents the last of n1 DUTs controlled by SCU 518.

SCU 521 is connected to DUT 522 and DUT 523 in parallel, where SCU 521 is connected to one or more DUTs via communication bus 521. DUT 522 represents the first of n2 DUTs, and DUT 523 represents the last of n2 DUT board controlled by SCE 522. The current invention architecture should be interpreted to facilitate a high degree of parallelism due to the many dedicated internal busses between connections.

Communication lines 515 and 517 provide facilitate additional communications as shown.

In a simple example dealing with volatile memories, MCU 505 applies only a single one of the test profiles 501 via network 503 to one or more SCUs 516, 521, and performs all required test using nominal PMU, CMU, and TMU settings, where the SCUs 516, 521 would apply required AC and DC level signals and test patterns to all the DUTs 519, 520, 522, 523, and each of DUTs 519, 520, 522, 523 performs the required tasks. The test results, with individual memory address locations for each memory die section, and data error log, can be recorded in the corresponding SCUs, and the aggregated logs can be provided to the MCU 505, and stored in the network 503 for further analysis. In this example the MCU 505 could program and test all sockets to test one type of volatile memory at nominal levels. In another example the same program could program and test the same volatile memory sockets, but with voltage variation using PMU 509, or clock frequency variation using CMU 510, or temperature variation using TMU 511. or a combination of one or more variations of PMU 509, CMU 510, and TMU 511 to test the same volatile memory sockets with multiple corner testing.

In another embodiment dealing with non-volatile memories, MCU 505 applies only a single one of the test profiles 501 via network 503 to one or more SCUs 516, 521, and performs all required test using nominal PMU, CMU, and TMU settings, where the SCUs 516, 521 would apply required AC and DC level signals and test patterns to all the DUTs 519, 520, 522, 523, and each of DUTs 519, 520, 522, 523 performs the required tasks. The test results, with individual memory address locations for each memory die section, and data error log, can be recorded in the corresponding SCUs, and the aggregated logs can be provided to the MCU 505, and stored in the network 503 for further analysis. In this example the MCU 505 could program and test all sockets to test one type of non-volatile memory at nominal levels. In another example the same program could program and test the same non-volatile memory sockets, but with voltage variation using PMU 509, or clock frequency variation using CMU 510, or temperature variation using TMU 511. or a combination of one or more variations of PMU 509, CMU 510, and TMU 511 to test the same volatile memory sockets with multiple corner testing.

In another embodiment dealing with both volatile and non-volatile memories, MCU 505 applies only a single one of the test profiles 501 via network 503 to one or more SCUs 516, 521, and performs all required test using nominal PMU, CMU, and TMU settings, where the SCUs 516, 521 would apply required AC and DC level signals and test patterns to all the DUTs 519, 520, 522, 523, and each of DUTs 519, 520, 522, 523 performs the required tasks. The test results, with individual memory address locations for each memory die section, and data error log, can be recorded in the corresponding SCUs, and the aggregated logs can be provided to the MCU 505, and stored in the network 503 for further analysis. In this example the MCU 505 could program and test some sockets to test one type of volatile memory, and some sockets to test one type of non-volatile memory at nominal levels. In another example the same program can apply to the same volatile and non-volatile memory sockets but with voltage variation using PMU, or clock frequency variation using CMU, or temperature variation using TMU or a combination of one or more variation of PMU, CMU, and TMU to test the same volatile and non-volatile memory sockets with multiple corner testing.

One or more of the SCUs are intelligent. In some embodiments, for example, the SCUs are configured to run functional test pattern(s) while the DUTs are running host application(s). In some embodiments, the SCUs can even run some or all of host application(s) using memories of the DUTs.

Figure 6:
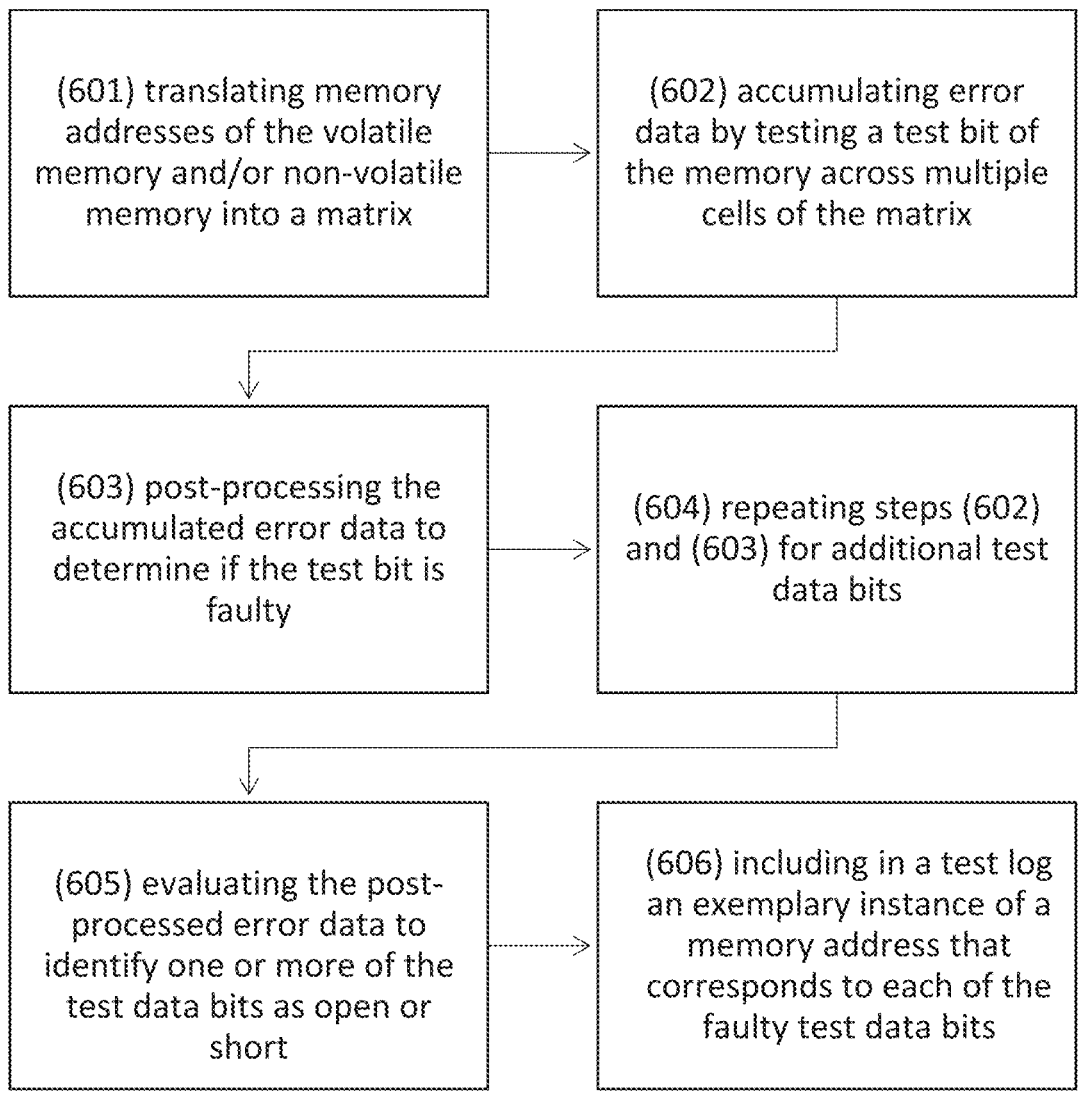
FIG. 6 is a diagram of steps in a contemplated method of the invention.

FIG. 6 is a diagram of steps in a contemplated method of the invention. Step 601 translating memory addresses of the volatile memory and/or non-volatile memory into a matrix; 602 accumulating error data by testing a test bit of the memory across multiple cells of the matrix; step 603 post-processing the accumulated error data to determine if the test bit is faulty; 604 repeating steps 602 and 603 for additional test bits; 605 evaluating the post-processed error data to identify one or more of the test bits as open or short; and step 606 including in a test log an exemplary instance (preferably only one) of a memory address that corresponds to each of the faulty test data bits.

Although certain preferred embodiments and examples are discussed above, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence.

What is claimed is:

1. A method of testing a memory in a Device Under Test (DUT), the method comprising:
   (a) translating memory addresses of the memory into a matrix;
   (b) accumulating error data by testing a test bit of the memory across multiple cells of the matrix;
   (c) post-processing the accumulated error data to determine if the test bit is faulty;
   (d) repeating steps (b) and (c) for additional test bits;
   (e) evaluating the post-processed error data to identify more than one of the test bits as open or short; and
   (f) including in a test log only one instance of a memory address that corresponds to one of the faulty test data bits.

2. The method of claim 1, comprising translating at least 8 Gbit of the memory addresses into the matrix.

3. The method of claim 1, further comprising translating at least 8 GB of the memory addresses into the matrix.

4. The method of claim 1, wherein the Device Under Test (DUT) includes at least two dies, and further comprising translating the memory addresses of the at least two dies into the matrix.

5. The method of claim 1, wherein the Device Under Test (DUT) wherein the matrix comprises first and second axes, the individual cells of the matrix include individual ones of the memory addresses, and the first axis designates the test bits.

6. The method of claim 5, wherein the first and second axes are rows and columns.

7. The method of claim 1, further comprising testing at least one of the test bits against a known manufacturing-related issue.

8. The method of claim 1, further comprising using a Slave Controller Unit (SCU) to perform at least step (b).

9. The method of claim 8, further comprising using the Slave Controller Unit (SCU) to additionally perform at least step (c).

10. The method of claim 8, further comprising using the Slave Controller Unit (SCU) to additionally perform at least step (e).

11. The method of claim 8, further comprising using a Master Controller Unit (MCU) to operate the Slave Controller Unit (SCU), and using the Master Controller Unit (SCU) to perform step (f).

12. The method of claim 8, further comprising using firmware in the first Slave Controller Unit (SCU) to perform at least step (b).

13. The method of claim 1, wherein the memory comprises volatile memory components.

14. The method of claim 1, wherein the memory comprises non-volatile memory components.

15. The method of claim 1, wherein the memory comprises a combination of volatile and non-volatile memory components.

16. A memory testing apparatus, comprising:
   a Master Controller Unit (MCU) configured to provide a first functional test pattern to each of at least a first Slave Controller Unit (first SCU) and a second Slave Controller Unit (second SCU);
   wherein the first SCU is configured to use the first functional test pattern to operate at least a first Device Under Test board (first DUT), and the second SCU is configured to use the first functional test pattern to operate at least a second Device Under Test board (second DUT) concurrently with operation of the second DUT;
   wherein the first SCU comprises firmware configured to selectively perform read/write tests on memory addresses of at least the first DUT;
   wherein the first SCU is configured to:
   (a) translate first memory addresses of a first memory of the first DUT into a first matrix;
   (b) accumulate error data from the first memory by testing a test bit of the first memory across multiple cells of the first matrix;

(c) post-process the accumulated error data from the first memory to determine if the test bit is faulty; and (d) repeat steps (b) and (c) for additional test bits from the first memory; and wherein at least one of the MCU and the first SCU is configured to:

(e) evaluating the post-processed error data to identify more than one of the test bits as open or short; and (f) including in a test log only one instance of a memory address that corresponds to one of the faulty test data bits.

17. The apparatus of claim 16, wherein the first SCU is configured to translate at least 8 Gbit of the first memory addresses into the first matrix.

18. The apparatus of claim 16, wherein the first SCU is configured to translate at least 8 GB of the first memory addresses into the first matrix.

19. The apparatus of claim 16, wherein the first matrix comprises at least first and second axes, and the first SCU is configured to translate the first memory addresses into individual cells of the first matrix, where the first axis designates the test bits.

20. The apparatus of claim 16, wherein the second MCU is configured to:

(g) translate memory addresses of a second memory of the second DUT into a second matrix;

(h) accumulate error data from the second memory by testing a test bit of the second memory across multiple cells of the second matrix;

(i) post-process the accumulated error data from the second memory to determine if the test bit is faulty; and (j) repeat steps (g) and (h) for additional test bits from the second memory;

wherein the second SCU is configured to:

(k) evaluating the post-processed error data to identify one or more of the test bits as open or short; and (l) including in a test log an exemplary instance of a memory address that corresponds to each of the faulty test data bits.

21. The apparatus of claim 16, wherein the second SCU is configured to include in the test log additional exemplary instances of the second memory addresses that correspond to additional ones of the faulty test bits, respectively.

22. The method of claim 16, wherein the memory comprises volatile memory components.

23. The method of claim 16, wherein the memory comprises non-volatile memory components.

24. The method of claim 16, wherein the memory comprises a combination of volatile and non-volatile memory components.

* * * * *